US007884626B2

(12) United States Patent
Peters

(10) Patent No.: US 7,884,626 B2
(45) Date of Patent: Feb. 8, 2011

(54) CATHODIC PROTECTION MONITOR

(75) Inventor: George W. Peters, Deltaville, VA (US)

(73) Assignee: OleumTech Corporation, Irvine, CA (US)

( * ) Notice: Subject to any disclaimer, the term of this patent is extended or adjusted under 35 U.S.C. 154(b) by 0 days.

(21) Appl. No.: 12/590,813

(22) Filed: Nov. 16, 2009

(65) Prior Publication Data

US 2010/0070104 A1 Mar. 18, 2010

Related U.S. Application Data

(62) Division of application No. 11/711,066, filed on Feb. 27, 2007, now Pat. No. 7,633,302.

(51) Int. Cl.
*G01R 27/08* (2006.01)

(52) U.S. Cl. .................... 324/700; 324/73.1; 205/775.5

(58) Field of Classification Search ................. 324/700, 324/73.1; 205/725, 728, 775.5
See application file for complete search history.

(56) References Cited

U.S. PATENT DOCUMENTS 4,356,444 A 10/1982 Saenz, Jr. et al.
5,792,337 A * 8/1998 Padovani et al. ......... 205/775.5
6,208,128 B1 * 3/2001 Braconnier et al. ........ 324/71.2
6,498,568 B1 12/2002 Austin et al.
6,992,594 B2 1/2006 Dudley
7,068,052 B2 6/2006 Hilleary et al.

* cited by examiner

*Primary Examiner*—Vincent Q Nguyen
(74) *Attorney, Agent, or Firm*—Morland C. Fischer

(57) ABSTRACT

A cathodic protection monitor to be electrically connected to a cathodic protection rectifier that is adapted to prevent rust, corrosion and possible leakage in an underground pipe or storage tank above which the rectifier is supported. The cathodic protection monitor includes a CPU that reads, digitizes and stores analog current and voltage signals which are supplied from the DC output of the rectifier and are indicative of the effectiveness thereof. The monitor includes an ISM band transceiver and antenna by which the CPU is polled and from which packets of stored data are transmitted to a data collector at an overhead airplane or nearby motor vehicle for retransmission and analysis by the pipe owner or maintenance crew. Synchronized timing signals are supplied (from the National Bureau of Standards) to a stable auxiliary clock by way of a WWVB transceiver and antenna so that a plurality of cathodic protection rectifiers can be turned on and off at the same time as may be required to compile ground voltage readings along the pipeline as part of a government-mandated survey.

5 Claims, 9 Drawing Sheets

NORMAL IDLE

POLL CPU 32
FOR DATA

CPU OF TRANSCEIVER 58

CONTROL OF RECTIFIER 100

NORMAL TIME UPDATE

CATHODIC PROTECTION MONITOR

This application is a division of application Ser. No. 11/711,066 filed Feb. 27, 2007, now U.S. Pat. No. 7,633,302.

BACKGROUND OF THE INVENTION

1. Field of the Invention

This invention relates to a cathodic protection monitor that is electrically connected to a conventional pole-mounted cathodic protection rectifier that is located above an underground oil, natural gas or water pipe (or storage tank) to reverse the effects of chemical and electrically-induced corrosion which are known to cause a potentially hazardous leak. The cathodic protection monitor receives analog current and voltage signals from the DC output terminals of the rectifier to be digitized, stored and transmitted (by antenna) on demand for analysis so that a determination can be made of the effectiveness of the rectifier and whether the rectifier is in need of repair or replacement.

2. Background Art

As will be explained in greater detail below, an underground natural gas, oil or water pipe or the tank in which such fluids flow or are stored and even an underwater bridge abutment is subject to chemical and electrically-induced corrosion, pitting and deterioration. Such deterioration can lead to leakage which can contaminate the soil above the pipe or tank. In some cases, an explosive condition can occur following pipe or tank erosion. As a consequence of the foregoing, a hazardous environmental condition may be created which will necessitate an expensive cleanup and an interruption of the flow of fluid through the effected pipe. Such a leak and flow interruption recently occurred in Alaska where metal pipes carrying oil were damaged by corrosion.

A known means to combat the negative effects of pipe or tank corrosion is impressed current cathodic protection (ICCP). In this case, a series of cathodic protection rectifiers are mounted on poles that are spaced from one another along the pipe run. Each of the cathodic protection rectifiers supplies a DC output current and voltage to the pipe to be protected and to an underground sacrificial anodic bed lying near the pipe. The function of the cathodic protection rectifier is to reverse the electrical potential through the ground and thereby cause the flow of electrons to travel from the anodic bed to the pipe (or tank) so as to arrest the electrolysis that causes rust and corrosion.

However, the chemical composition and moisture content of the soil in which a pipe or tank is buried often changes over time. Such changing soil conditions may require an adjustment to the cathodic protection rectifier. In other cases, the rectifier may not function properly or fail and be in need of repair or replacement. A common technique for manually monitoring each of the series of pole-mounted rectifiers stationed along the pipeline is inefficient, time consuming, and correspondingly costly.

Accordingly, it would be advantageous to have an electronic monitor connected to the cathodic protection rectifier to efficiently, reliably, and inexpensively collect data that is transmitted from the rectifier to verify the operating characteristics thereof so that the pipe or tank owner or maintenance crew can be alerted as to the need to inspect a suspect rectifier. At the same time, it would also be desirable for a cathodic protection monitor to be able to cause its cathodic protection rectifier to be cycled on and off in synchronization with powering other rectifiers that are stationed along the pipeline so that a government-mandated survey of ground voltage can be completed when all of the rectifiers are repeatedly disabled and then enabled throughout the period during which the survey is conducted.

SUMMARY OF THE INVENTION

In general terms, a cathodic protection monitor is disclosed to be electrically connected to a pole-mounted cathodic protection rectifier that is adapted to prevent corrosion of an underground metal oil, gas, or water pipe or an underground storage tank. First and second pairs of wires are connected from the DC output of the cathodic protection rectifier, via a surge protector and an opto-isolator, to an analog-to-digital converter of a central processing unit (CPU) of the cathodic protection monitor. A first of the pairs of wires carries a first analog voltage signal that is indicative of the DC output current through a shunt resistor of the cathodic protection rectifier. A second pair of wires carries a second analog voltage signal that is indicative of the DC output voltage of the rectifier.

The analog current and voltage signals supplied from the DC output of the rectifier are digitized and stored in the memory of the CPU. To this end, an on-board clock wakes the normally inactive CPU so that the analog current and voltage signals will be sampled, digitized and stored at programmable (e.g., 15-minute) intervals. A backup watchdog timer will time out and wake the CPU in the event that the CPU is not awakened by its internal clock to sample the analog data.

A low power transceiver of the cathodic protection monitor having a narrow beam antenna is connected to an I/O terminal of the CPU. Either a low flying airplane (which is regularly used to visually inspect the pipeline and/or the ground around the pipeline) or a motor vehicle driving near the cathodic protection rectifier can poll the CPU with a coded command signal that is transmitted to the CPU by way of the transceiver and its antenna. Once it is polled, the CPU will send a data packet containing its stored digitized current and voltage data for transmission back to the airplane or motor vehicle via the transceiver and antenna so that the data from all of the cathodic protection rectifiers along the pipeline can be efficiently collected for analysis by the pipe owner or maintenance crew to determine if any rectifier is in need of repair or replacement. By virtue of the foregoing, the time consuming and costly manual rectifier data collection technique, where a workman traditionally drives along the entire pipeline from one cathodic protection monitor to the next, is advantageously avoided.

A periodic (e.g., yearly) government-mandated survey is typically required of underground pipe owners to measure the ground voltage around the pipe to ensure that the cathodic protection rectifiers are correctly adjusted and operating properly. To collect data for this survey, all of the cathodic protection rectifiers along the pipeline must be simultaneously cycled on and off throughout the survey period so that the ground voltage readings can be taken at spaced intervals. A WWVB receiver having a highly accurate (1 ppm) auxiliary clock is connected to an I/O terminal of the CPU. The receiver has an antenna that is tuned to receive clock timing signals that are generated by the National Bureau of Standards at Boulder, Colo. In this manner, the auxiliary clocks from all of the cathodic protection monitors along the pipeline can be synchronized with one another to generate clock control signals for causing the cathodic protection rectifiers to turn on and off at exactly the same time to enable accurate survey data to be collected.

More particularly, an auxiliary clock controlled relay-enable signal is supplied from an output terminal of the CPU of the cathodic protection monitor to a relay control switch. The relay control switch is connected to a rectifier control relay which, in turn, is connected to one side of the cathodic protection rectifier or between the AC power lines and the rectifier. The rectifier control relay is energized and de-energized as the relay control switch is closed and opened by which to correspondingly turn the cathodic protection rectifier on and off. Because of the synchronized clock control signals supplied from the auxiliary clocks to the CPUs of the cathodic protection monitors along the pipeline, all of the rectifiers will be simultaneously cycled on and off until the ground voltage survey has been completed.

DESCRIPTION OF THE PREFERRED EMBODIMENT

Figure 1:
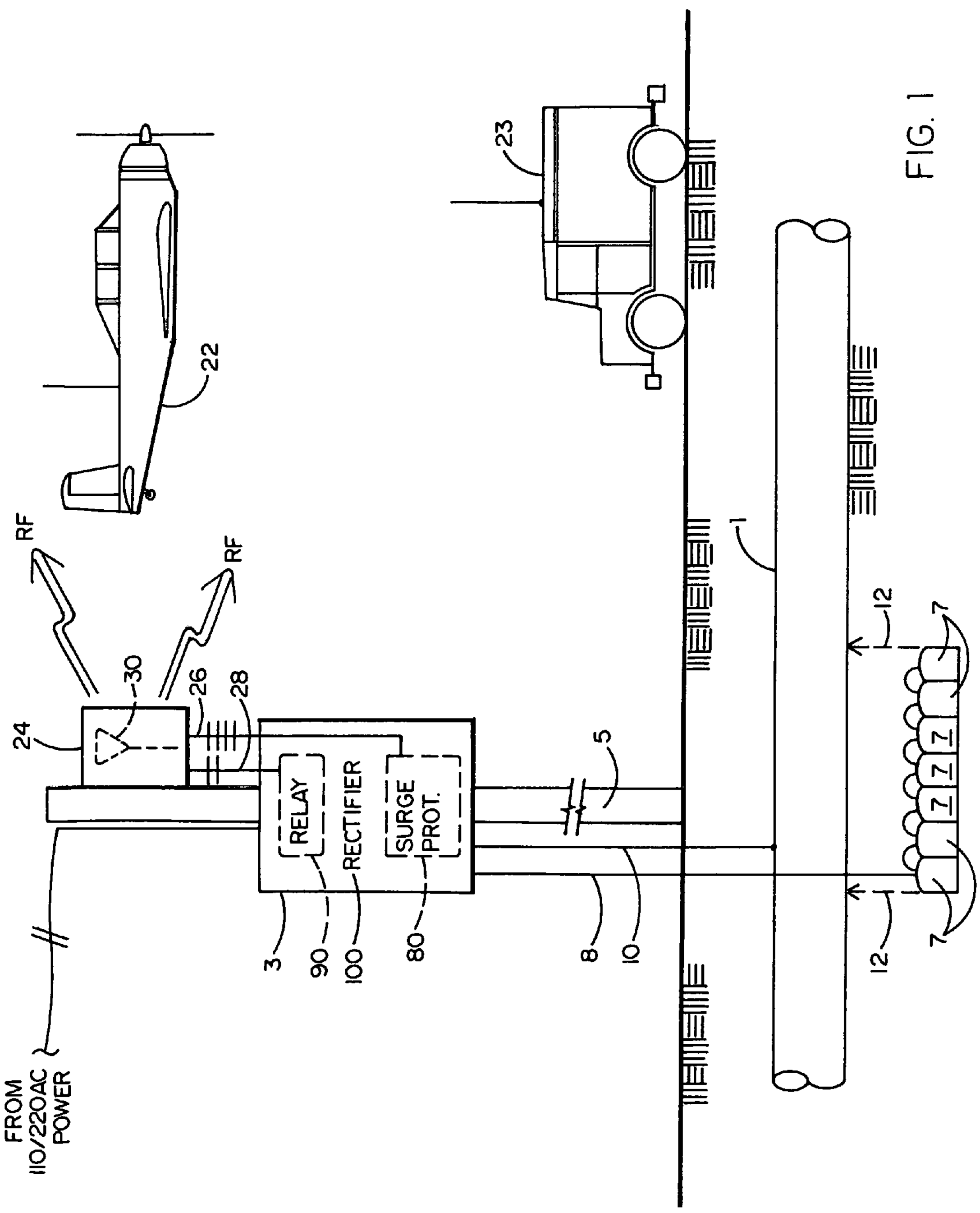
FIG. 1 illustrates the cathodic protection monitor of this invention electrically connected to a cathodic protection monitor that is suspended above an underground pipeline to be protected against corrosion.

Referring initially to FIG. 1 of the drawings, there is shown an underground metal pipe 1 of the type that carries natural gas, oil or water. However, the pipe 1 could also be an underground storage tank. Because of the acidity and composition of below ground dirt and water that surrounds pipe 1, the pipe (or tank) is known to experience rust and corrosion. Such rust and corrosion, if not prevented, can lead to a gradual erosion of the pipe and a subsequent leak of the fluid carried thereby. In the case where the fluid is oil, the resulting leakage can contaminate the ground adjacent the pipe leading to a potentially hazardous condition and an expensive cleanup operation.

One effective technique to combat corrosion of the pipe 1 is by means of cathodic protection. In general, a cathodic protection rectifier 100 is enclosed by a metallic casing 3 that is commonly mounted on a pole 5 (e.g., a telephone pole) that is staked in the ground near the pipe 1 to be protected. The rectifier 100 within casing 3 is powered by way of a pair of 110/220 volt AC power lines. A sacrificial bed including metallic elements 7 such as zinc, copper, or the like, is located below the ground so as to lie approximately three to ten feet away from one side of the pipe 1 to be protected. Such sacrificial metallic elements 7 are ultimately consumed during the cathodic protection technique and, therefore, will typically be in need of replacement every five to ten years. This same cathodic protection technique is also applicable to protecting an underground storage tank (not shown) against rust, corrosion and possible leakage.

Figure 3:
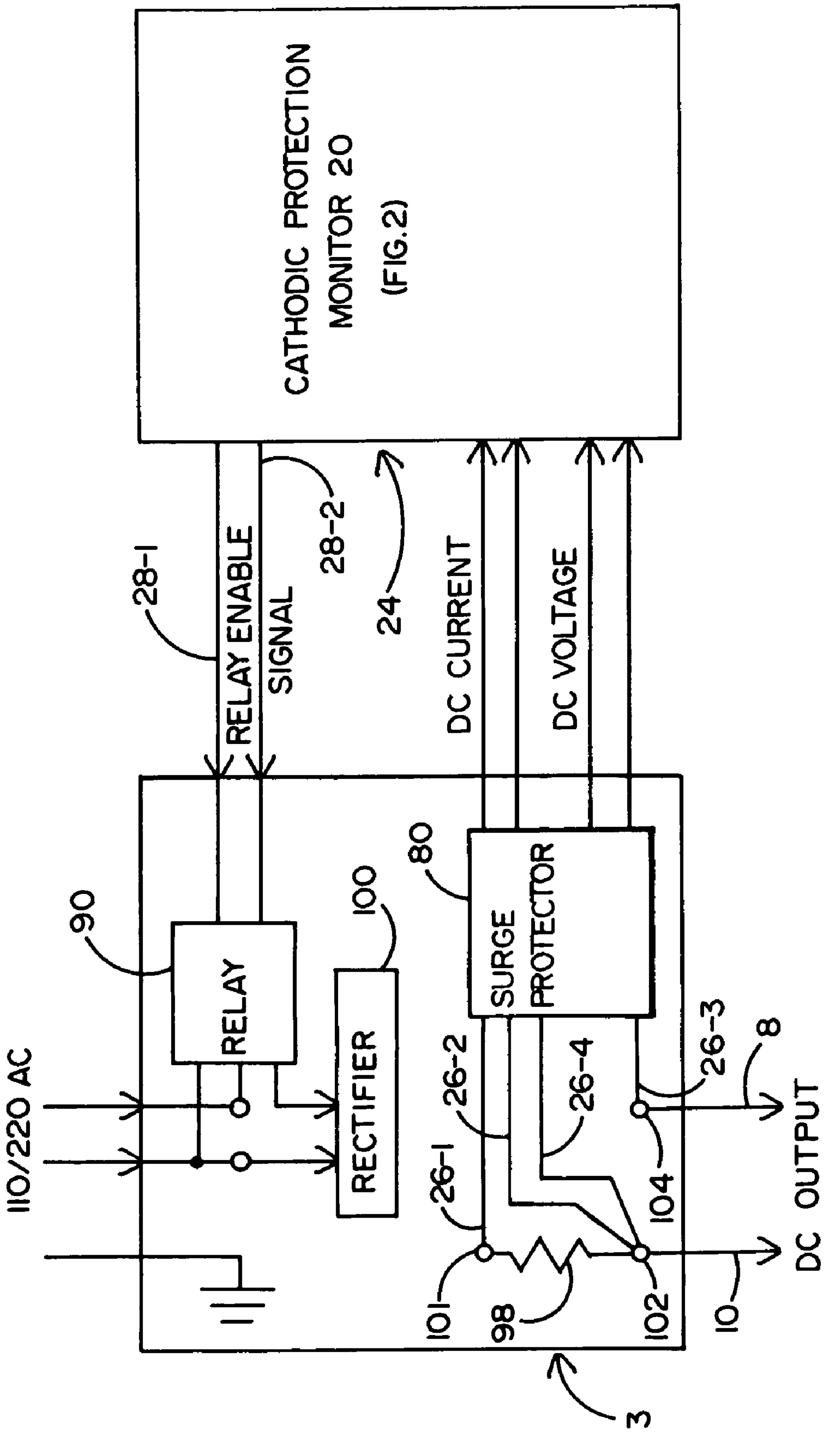
FIG. 3 is a block diagram which shows details of the electrical connection between the cathodic protection rectifier and the cathodic protection monitor.

As is also shown in FIG. 3, a DC output voltage is provided from the cathodic protection rectifier 100 within casing 3 to the underground sacrificial metal elements 7 by means of a first conductive wire 8. A DC output current is also provided from rectifier 100 to the underground metal pipe 1 (or storage tank) by means of a second conductive wire 10. The function of the rectifier in the cathodic protection technique is to reverse the electrical potential through the ground to the pipe 1 so as to arrest the corrosive effects on the pipe (or tank) being buried underground and prevent electrolysis from eating holes in the pipe which are known to lead to pipe rupture and possible leakage.

That is, the underground sacrificial elements 7 function as positively charged electrical anodes in an electrical circuit that includes the surface of the metal pipe 1. In the cathodic protection technique, an electrical potential and the electron flow is now in a direction away from the annodic sacrificial elements 7 and towards the metal pipe (represented by the direction of reference arrows 12 of FIG. 1). Hence, electrolysis will be reversed (i.e., the electron flow is from a positive to a negative electrode) so that the deleterious effects of below ground pipe (or tank) corrosion and pitting can be reliably avoided.

For pipelines which span many miles, a series of cathodic protection rectifiers surrounded by their casings 3 are mounted on poles 5 that are spread out along the pipe. To avoid rust and corrosion of the pipeline, an inspection is required to ensure that each cathodic protection rectifier is functioning in its intended manner. What is more, the chemical composition (e.g., acidity) and moisture content of the ground in which the pipe is buried often changes over time which may necessitate that an adjustment be made to the cathodic protection rectifier to ensure proper electron flow from the sacrificial metal anodes (7 of FIG. 1) to the pipe. To accomplish the foregoing, output current and voltage readings are collected and examined for abnormalities as an indication of a potential malfunction and a necessity for a work crew to examine the cathodic rectifier in need of modification or repair.

For example, readings of the electrical current running along the pipe 1 via wire 10 and the electrical voltage between wires 8 and 10 are taken and compared with predetermined readings that are indicative of normal cathodic rectifier operation. Such readings are usually collected manually by a workman who must drive many miles from site to site, unlock a protective fence around the pole mounted rectifier casing 3, access the current and voltage data, either write down the data or connect a laptop computer or similar storage device to an appropriate data port to store the data, close the protective fence, and drive to the next site. Such a manual reading operation covering many miles of pipeline is very time consuming, inefficient and correspondingly expensive.

In some cases, a cell phone channel is used for transmitting and collecting the current and voltage data. However, data that is transmitted via a wireless cell phone link can lead to significant cost when there are many rectifier sites. Moreover, a workman may not find adequate cell phone coverage in all of the remote areas along which the protected pipeline is extended. Consequently, the cell phone transmitted data may be either partially or altogether lost at different locations. What is still more, cell phones are known to introduce timing synchronization errors when the electrolysis condition of the entire pipeline is monitored during periodic government mandated ground voltage surveys (to be described in greater detail hereinafter).

To overcome some of the aforementioned problems, it is known to collect the current and voltage data by means of an overhead satellite that communicates with an antenna of the cathodic rectifier. However, such satellite data collection requires access to a satellite which, in and of itself, can be very expensive to those who own or maintain the pipeline.

Figure 2:
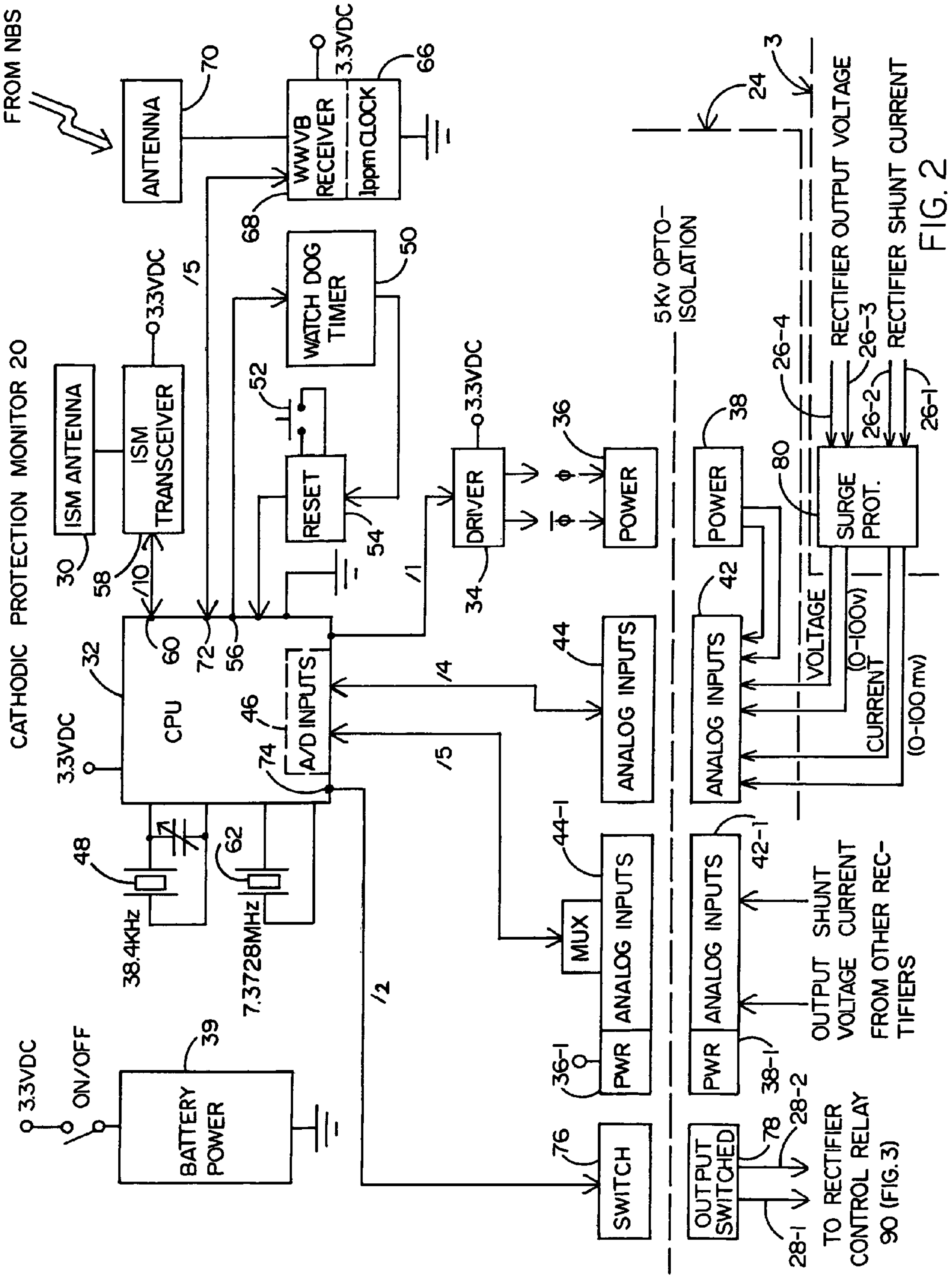
FIG. 2 is a block diagram which shows details of the cathodic protection monitor of FIG. 1 according to a preferred embodiment.

According to the present improvement, a method and system are disclosed for monitoring and collecting current and voltage data that is indicative of the effectiveness of the cathodic protection to be afforded to the underground pipe 1 (or tank) by virtue of the aforementioned pole mounted cathodic rectifier 100. More particularly, a cathodic protection monitor (the details of which are shown in FIG. 2) is capable of transmitting data to the antenna of an low flying airplane 22 or a nearby motor vehicle 23 which drives by the pole mounted cathodic protection monitor so that the rectifier data can be quickly and efficiently collected and stored and, if necessary, retransmitted to one who owns or is responsible for maintaining the pipeline. In this manner, the cost to monitor all of the pole mounted rectifiers stationed along the pipeline (relative to the conventional manual and satellite monitoring described above) can be significantly reduced. In the case of airplane 22, data can be received from monitor 20 at the same time that the airplane is used to make regular visual inspections of the pipe 1 and/or the ground adjacent the pipe.

To this end, the cathodic protection monitor (designated 20 in FIG. 2) is surrounded by a non-metallic (e.g., polycarbonate) weather resistant casing 24 that is mounted on the same upstanding pole 5 from which the cathodic rectifier casing 3 is suspended. As will be explained when referring to FIG. 3, four wires 26 are connected (via a surge protector 80) from the DC output of the rectifier 100 within casing 3 to the cathodic protection monitor 20 within casing 24, whereby the monitor 20 will receive analog input signals that are indicative of the rectifier output current to the pipe 1 (via wire 10) and the rectifier output voltage (between wires 8 and 10). Digital representations of the current and voltage signals are transmitted by an internal ISM band antenna 30 of the cathodic protection monitor 20 in casing 24 in a relatively narrow (e.g., 40 degrees) radiation beam pattern to the low flying airplane 22 at which the data is collected and stored (or retransmitted) for analysis. As indicated earlier, the digital representation of the output current and voltage data from the cathodic protection rectifier 100 may also be transmitted from the internal antenna 30 to a motor vehicle 23 driving in the vicinity of the monitor.

A pair of wires 28 is coupled from the cathodic protection monitor 20 (of FIG. 2) to a rectifier control relay (designated 90 in FIG. 3) of the cathodic protection rectifier 100 within casing 3. The precise function of control relay 90 relative to the cathodic protection rectifier during a periodic government-mandated survey will be described below.

Turning now to FIG. 2 of the drawings, details are provided of the cathodic protection monitor 20 that is enclosed within the pole mounted casing 24 of FIG. 1. Monitor 20 is controlled by a central processing unit (CPU) 32 comprising a commercially available microprocessor. A suitable microprocessor for CPU 32 is Part No. MPS 430 available from Texas Instruments and other manufacturers. DC power for monitor 20 is provided by a 3.3 volt battery supply 39.

As previously disclosed, four wires 26 carry analog input signals to monitor 20 of FIG. 2 that are indicative of the output current and voltage of the cathodic protection rectifier 100 within protective casing 3. A first pair of wires 26-1 and 26-2 are connected to respective terminals at opposite sides of a shunt resistor (designated 98 in FIG. 3) to receive a DC voltage signal (e.g., between 0-100 mv) that is indicative of the rectifier output current through the resistor. A second pair of wires 26-3 and 26-4 are connected to receive a DC voltage signal (e.g., between 0-100 v) that is indicative of the rectifier output voltage. The analog current and voltage signals are supplied via the pairs of wires 26-1, 26-2 and 26-3, 26-4 to the surge protector 80 within the rectifier casing 3 to reduce the negative effects of voltage surges and current spikes such as that caused by lighting which could destroy the cathodic protection monitor 20 or affect the reliability of the input signals received thereby.

The analog current and voltage input signals are supplied from surge protector 80 to a pair of linear opto-isolators 42 and 44 that are separated from one another by a protective 5 Kv gap. The analog current and voltage input signals are applied from one 44 of the pair of opto-isolators to an input terminal of an analog-to-digital (A/D) converter 46 of the CPU 32. An analog power supply having a push-pull driver 34 and a pair of step-up transformers (only one of which being shown) with each transformer having primary and secondary windings 36 and 38 that are separated from one another by the 5 Kv opto-isolation gap is connected to the other one 42 of the opto-isolators to cause the analog current and voltage input signals to be isolated from the A/D converter 46 of CPU 32 so that the analog signals will be immune to spurious interference. The A/D converter 46 converts the analog current and voltage signals supplied from the cathodic protection rectifier 100 into corresponding digital signals to be stored in the memory of CPU 32. The cathodic protection monitor 20 is also provided with an additional pair of opto-isolators 44-1 and 44-2 and power transformers 36-1 and 38-1 to receive additional analog current and voltage input signals from other nearby cathodic protection rectifiers of intersecting pipes to be supplied (via a multiplexer) to the A/D converter 46 of CPU 32.

A first on-board 38.4 KHz real time clock 48 causes the normally inactive CPU 32 to wake up and read the analog (current and voltage) signals from the cathodic protection rectifier (designated 100 in FIG. 3) at predetermined programmable (e.g., 15 minute) intervals. However, if the CPU 32 fails to read the analog signals for longer than the predetermined time interval, a standby watchdog timer 50 will time out and send a reset signal to reset logic 54 to initiate the data sampling. The CPU 32 can also be awakened manually at any time to initiate the data sampling by closing a manually-operated reset switch 52 that is connected to reset logic 54. Each time the CPU 32 samples the current and voltage signal data from the cathodic protection rectifier, a reset signal is generated from an output terminal 56 of the CPU to reset the watchdog timer 50.

Unless it is first awakened by internal clock 48 or watchdog timer 50, the CPU 32 is inactive, (i.e., asleep). While it is awake, the CPU 32 reads, digitizes and stores the input current and voltage data supplied to A/D converter 46 via wire pairs 26-1, 26-2 and 26-3, 26-4. In this regard, a low power, RF (e.g., 915 MHz) ISM band transceiver 58 of monitor 20 which includes the aforementioned internal narrow beam antenna 30 is connected to an I/O terminal 60 of the CPU 32. An overhead airplane (22 in FIG. 1) or a passing motor vehicle (23 in FIG. 1) traveling from one cathodic protection site to the next along the pipeline can selectively poll (i.e., interrogate) the CPU 32 by sending a coded command signal to I/O terminal 60 by way of antenna 30 and transceiver 58.

Once it is polled, the CPU 32 will send a data packet including the digital current and voltage signal data that has been read from the rectifier and stored following digitization by A/D converter 46. Other data to be included in the data packet is the ID of the monitor 20, the condition of battery voltage 39, whether the watchdog timer 50 has timed out or reset button 54 has been depressed, and whether a soon-to-be-described WWVB receiver 68 is functioning properly. Such digital signal data is transmitted to the airplane 22 (or motor vehicle 23) via I/O terminal 60, transceiver 58 and antenna 30. The transmitted data may be stored in a data collector of the airplane (or motor vehicle) and downlinked to a computer, the internet, a network or directly to the pipe owner or maintenance crew for analysis. Once the CPU 32 has dumped its stored digital signal data, it collects a new batch of current and voltage data until it is once again polled by the airplane or motor vehicle.

As earlier described, the government requires that underground pipe (and tank) owners conduct a periodic survey (e.g., once per year) of ground voltage to ensure that the potential of the pipe is reversed by the rectifier to avoid the negative effects of electrolysis. To accomplish the foregoing, a workman must typically walk the entire length of the pipeline to conduct the survey by using a pair of pole probes that are momentarily implanted to measure the electrical potential between the pipe and the soil in which the pipe is buried. The failure of the pipe owner to properly protect the pipe and its insulation from damage as a consequence of both cathodic erosion and accidental rupture can lead to a hazardous leak as well as to an interruption of flow until repairs are made to the damaged pipe.

To efficiently and accurately compile survey data, it is essential that all of the cathodic protection rectifiers along the entire pipeline be cycled on and off in synchronization with one another throughout the entire period (such as throughout an eight hour work day) during which the survey is conducted. The workman will read the ground voltage at spaced locations along the pipeline when all of the rectifiers are simultaneously turned off and again when all of the rectifiers are simultaneously turned on before moving from a first test location to the next.

Synchronization of the on/off power cycling of all of the cathodic protection rectifiers has been a problem for pipe owners. In many cases, an orbiting GPS satellite has been used to transmit timing control signals to the rectifiers. However, and as has already been explained, the cost to acquire access to a satellite is considerable. Moreover, overhanging trees and climatic conditions can interfere with satellite communications. What is even more, the use of cell phones has not provided the synchronized cycling accuracy that is required to simultaneously control many rectifiers that are spaced from one another along an extended pipe run. In this same regard, the CPU 32 of cathodic protection monitor 20 has an internal 7.3728 MHz clock 62 which controls the timing thereof. Because it is located out of doors and subjected to heat and cold temperature swings, the clock 62 is not as accurate as is required to generate rectifier synchronization signals during the ground voltage survey.

To overcome the aforementioned cathodic protection rectifier synchronization problem, and as another important aspect of the present invention, the cathodic protection monitor 20 of FIG. 2 is provided with a highly temperature stable 16.000 MHz standby or auxiliary clock oscillator 66 that is only activated during the ground survey and is accurate to one part per million. The auxiliary clock oscillator 66 is provided with an on-board, low current WWVB receiver 68 and a matched antenna 70 (e.g., a small ferret rod). The antenna 70 is tuned to 60.000 KHz in order to receive clock timing signals which originate from the National Bureau of Standards in Boulder, Colo. In this manner, the auxiliary clock oscillator 66 of each cathodic protection monitor 20 along the pipeline can be synchronized to cause the series of spaced cathodic protection rectifiers to cycle on and off at exactly the same time.

Accordingly, a highly accurate and synchronized clock control signal is supplied form the auxiliary clock oscillator 66 to an I/O terminal 72 of CPU 32. The clock control signal is used by CPU 32 to operate the rectifier control relay 90 (shown in FIG. 1 and to be described when referring hereinafter to FIG. 3) which causes the cathodic protection rectifier (100 of FIG. 3) to cycle on and off throughout a predetermined time during which the ground voltage survey will be conducted.

More particularly, a programmable relay-enable signal that is dependent upon the synchronized clock control signal provided by auxiliary clock 66 is supplied from an output terminal 74 of CPU 32 to a normally open 90-270 volt AC switch 76. The switch 76 is coupled across a gap to a (e.g., 5 Kv) opto-isolator stage 78 so as to reduce any extraneous voltage fluctuations that could affect the timing of the relay-enable signal. The opto-isolator stage 78 of switch 76 provides a switched output to the rectifier control relay (90 of FIG. 3) of the cathodic protection rectifier 100 (also of FIG. 3) by way of a pair of wires 28-1 and 28-2. Switch 76 is repeatedly closed and opened to generate a corresponding switched output from opto-isolator stage 78 that cycles between on and off states by which to either energize or de-energize the rectifier control relay 90.

Turning in this regard to FIG. 3 of the drawings, there is shown the pole mounted protective casing 3 (of FIG. 1) within which one of a plurality of cathodic protection rectifiers 100 is stationed above the underground pipe 1 (also of FIG. 1). Inasmuch as the rectifier 100 is conventional to cathodic protection techniques, the details thereof will not be provided herein. Also located within casing 3 is the rectifier control relay 90. The rectifier control relay 90 is preferably connected to one side (e.g., the DC side) of rectifier 100 to control power to pipe 1. As was described while referring to FIG. 2, the rectifier control relay 90 of FIG. 3 is energized and de-energized by means of an accurate and synchronized clock controlled switched output signal that is supplied via the pair of wires 28-1 and 28-2 from the opto-isolator stage 78 of the switch 76 of the cathodic protection monitor 20 of FIG. 2.

When the switched output signal that is carried by wires 28-1 and 28-2 is cycled to an on state, the rectifier control relay 90 will be energized and opened to thereby interrupt the (e.g., DC) side of cathodic protection rectifier 100, whereby rectifier 100 and all of the other pole mounted rectifiers along the pipeline will be simultaneously and temporarily turned off. When the switched output signal is cycled to an off state, the rectifier control relay 90 be de-energized and closed, whereby rectifier 100 and all of the other rectifiers will be simultaneously turned on. Such on and off power cycling of the rectifier 100 will continue for a predetermined time during the work day until the (annual) survey has been completed. Although the rectifier 100 has been described herein as being cycled on and off by a rectifier control relay 90, it is to be understood that rectifier 100 can also be controlled by means of a suitable solid state switch, or the like. What is more, rather than interrupt a side of the rectifier 100, the rectifier control relay 90 may also interrupt the 110/220 AC power line voltage to cause the rectifier 100 to be repeatedly turned off and on.

FIG. 3 also illustrates the wire connections at the DC output terminals 101, 102 and 104 of cathodic protection rectifier 100 by which current and voltage signals are derived and supplied as analog input signals to the cathodic protection monitor 20 to be digitized and stored and transmitted to an overhead airplane or nearby motor vehicle in the manner that was explained while referring to FIG. 2. As was earlier disclosed, a first pair of wires 26-1 and 26-2 are connected to respective terminals 101 and 102 at opposite ends of a shunt resistor 98 to receive a voltage that is indicative of the DC current flowing through shunt resistor 98 and available at the output terminal 102 of rectifier 100 to be supplied to the underground pipe (designated 1 in FIG. 1) via wire 10. A second pair of wires 26-3 and 26-4 are connected to respective output terminals 102 and 104 of rectifier 100 to receive a DC voltage. The output terminal 104 of rectifier 100 is connected by wire 8 to the underground sacrificial anodic elements (designated 7 in FIG. 1) lying adjacent the pipe 1.

Figure 4:
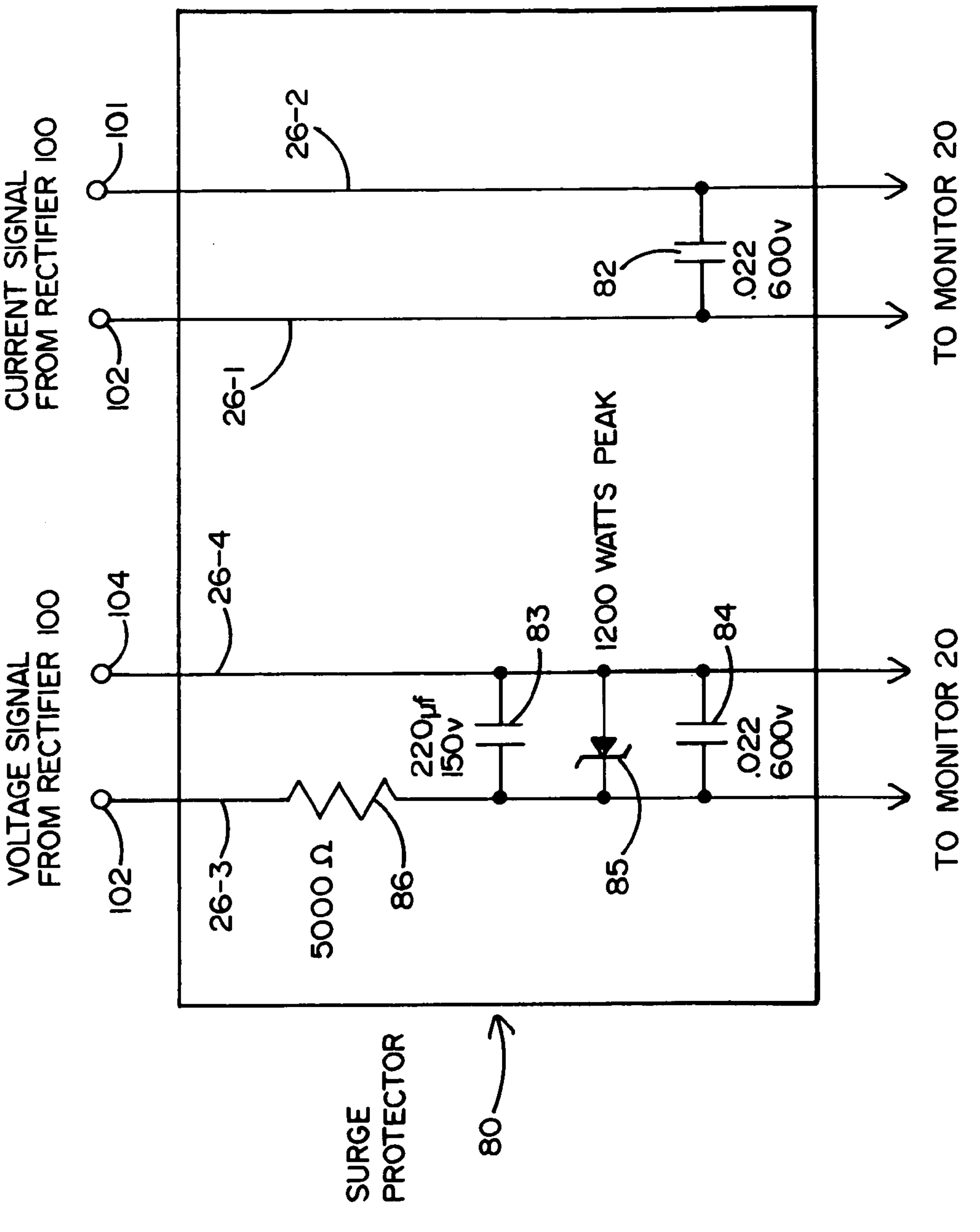
FIG. 4 shows details of a surge protector through which the cathodic protection rectifier is electrically connected to the cathodic protection monitor.

The pairs of wires 26-1, 26-2 and 26-3, 26-4 are connected to the cathodic protection monitor through the surge protector 80, the details of which are provided while referring to FIG. 4 of the drawings. The current and voltage signals that are carried by each pair of wires are protected against high voltage surges (such as that caused by lightning) and current spikes so as to prevent a destruction of the cathodic protection monitor 20 as well as a distortion of the data that is required for analysis to evaluate the effectiveness of the cathodic protection rectifier.

A spike suppressing capacitor 82 is connected between the first pair of wires 26-1 and 26-2 which, as best shown in FIG. 3, are connected to terminals 101 and 102 at opposite ends of the shunt resistor 98 to receive a (e.g., 0-100 mv) voltage that is indicative of the DC output current of cathodic protection rectifier 100. A pair of capacitors 83 and 84 are connected between the second pair of wires 26-3 and 26-4 that are connected to respective rectifier output terminals 102 and 104 to receive a (e.g., 0-100 v) voltage that is indicative of the DC output voltage of rectifier 100. A 1200 watt (peak), 150 volt transorb 85 to limit voltage spikes is also connected between the wires 26-3 and 26-4. In order to be able to absorb high peak energy surges to which the surge protector 80 is exposed, a large (e.g., 5000 ohm) disk resistor 86 (e.g., Part No. W0328D5021 from HVR Power Components) capable of absorbing 5000 joules of energy is connected in wire 26-3 so as to lie in electrical series with the parallel connected capacitors 93 and 94 and the varistor 85. No earth (ground) returns are required by surge protector 80.

The surge protector 80 shown in FIG. 4 is capable of withstanding a maximum (peak) voltage of 35 Kv and a maximum (peak) current of 6,250 amps. The recovery time of surge protector 80 is about 20 seconds following a first voltage surge and about a minute following a second surge that is successive to the first voltage surge.

Figure 5:
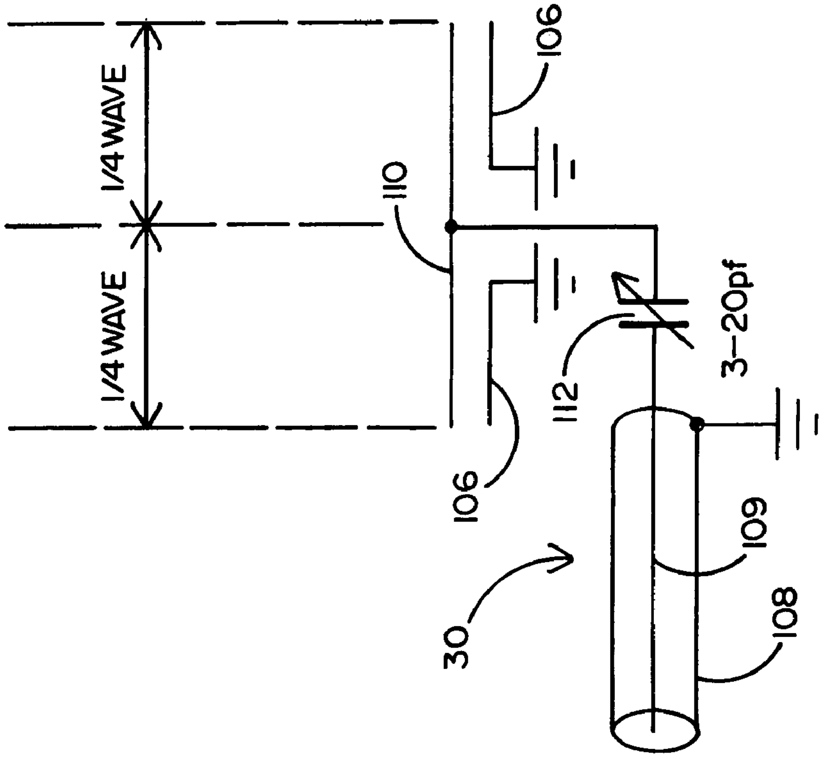
FIG. 5 shows a schematic for an ISM band antenna by which rectifier data stored in a CPU of the cathodic protection monitor is transmitted to an overhead airplane or a nearly motor vehicle.

FIG. 5 of the drawings illustrates details for the RF (e.g., 915 MHz) ISM band antenna 30 according to a preferred embodiment (to minimize manufacturing and installation costs and reduce the risk of a lightning strike) that is coupled to the ISM transceiver 58 of the cathodic protection monitor 20 of FIG. 2. As explained while referring to FIG. 1, antenna 30 is an internal antenna that is located inside the non-metallic (e.g., polycarbonate) casing 24 of monitor 20.

The ISM antenna 30 of FIG. 5 can be fabricated on a printed circuit board (FR-4 material) as a standard di-pole top-loaded device with a single ground connected reflector 106. Antenna 30 is center-loaded having a low loss RG 316 coaxial cable 108 with the center conductor 109 connected to the radiator element 110 through a variable capacitor 112. The radiator element (e.g., a strip line) 110 is horizontally aligned relative to the ground to increase the signal strength upwards in the direction of a low flying airplane 22 (of FIG. 1) traveling at a speed of about 180 mph and at an altitude of preferably between 200 to 1,000 feet. The beam width of antenna 30 to −3 db is 45 degrees which creates a horizontally polarized signal that matches the antenna (designated 120 in FIG. 6) that is carried by the airplane 22. The (e.g., 3-20 pf) capacitor 112 loads the ISM transceiver 58 (of FIG. 2) to which ISM antenna 30 is coupled. The antenna 30 has an impedance of about 50 ohms. Power is limited to about 3 mw for transmitting a detectable signal to an altitude of 1,000 feet. The side lobes allow a horizontal signal to 500 feet for ground data collection by the motor vehicle 23 (of FIG. 1).

Figure 6:
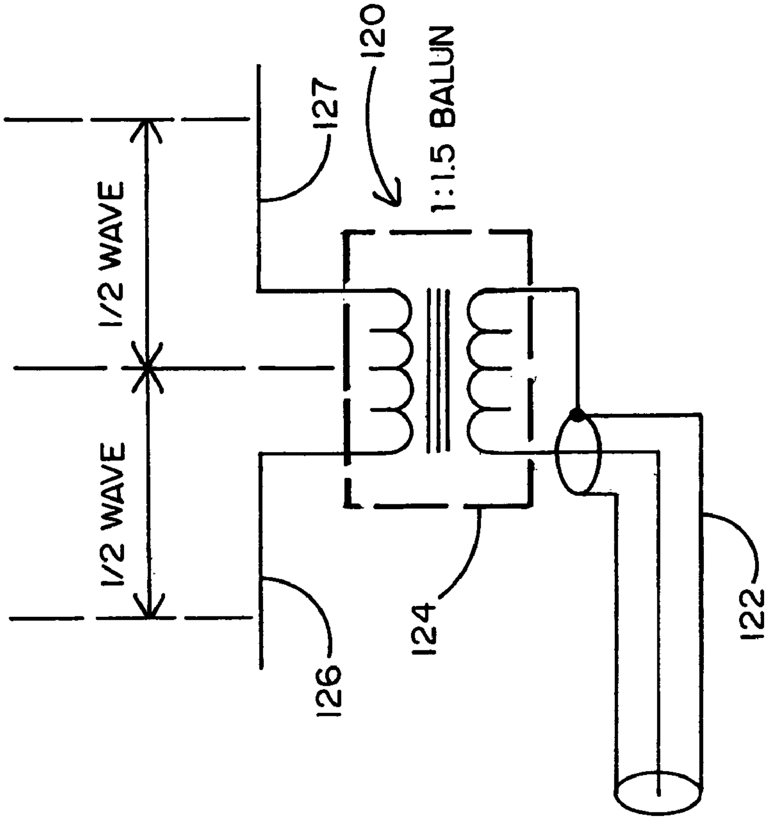
FIG. 6 shows a schematic for an ISM band antenna to be mounted in the airplane or motor vehicle to receive the rectifier data being transmitted from the cathodic protection monitor.

FIG. 6 of the drawings illustrates details for an antenna 120 that is connected via a (e.g., 15 foot) low loss RG 316 coaxial cable 122 to the data collector of the overhead, low-flying airplane 22 or motor vehicle 23 (of FIG. 1) that travels in the vicinity of the cathodic protection monitor 20 and the ISM band antenna 30 thereof. A suitable data collector (with added memory) to be interconnected with antenna 120 is shown in my earlier U.S. Pat. No. 6,967,589. However, in the present case, data that is transmitted to the data collector is not retransmitted, but is stored in memory to be accessed later for evaluation.

Antenna 120 is an RF (e.g., 915 MHz) ISM band, passive ½ wave center-loaded device with a 50 ohm impedance and a 1:1.5 balun transformer 124 that is mounted on the aircraft in accordance with FAA requirements. In this regard, the coaxial cable 122 is connected by way of transformer 124 to radiator elements 126 and 127 which are 180 degrees out of phase with one another. The antenna 120 may be mounted in the fiberglass tail cone, the wing tip, or any other suitable non-metallic location of the airplane 22. The antenna 120 may also be mounted to any non-metallic surface of the motor vehicle 23. Like the ISM antenna 30 of FIG. 5, the ISM antenna 120 of FIG. 6 can be fabricated on a printed circuit board (FR-4 material).

Figure 7:
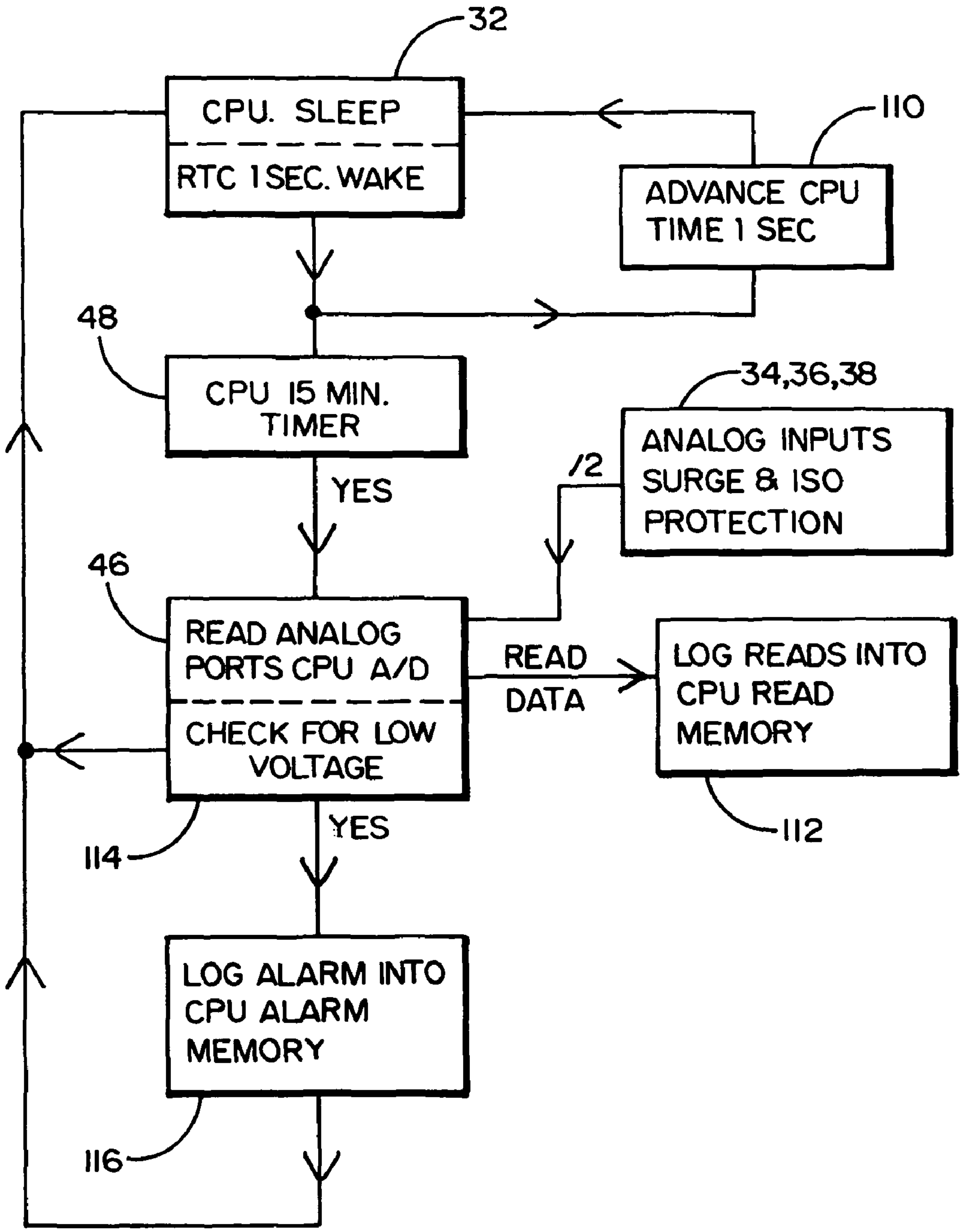
FIGS. 7-11 illustrate the software control of the cathodic protection monitor of FIG. 2.

A brief summary of the software control of the hardware associated with the cathodic protection monitor 20 of FIG. 2 is now provided while referring to FIGS. 7-11 of the drawings. FIG. 7 represents the activity of monitor 20 when at idle and immediately prior to receiving analog current and voltage input signals from the cathodic protection rectifier 100 of FIG. 3. Initially, the CPU 32 is in a low power sleep mode. An internal timer 110 continuously counts by one second intervals. In the example shown in FIG. 2, the CPU 32 is awakened to receive input data each time the onboard preprogrammed 15-minute clock 48 times out. Before the analog voltage and current input signals are read, the analog power supply of FIG. 2 (including driver 34 and the primary and secondary windings 36 and 38 of each of the pair of push-pull step-up transformers) is enabled to provide opto-isolation for the input signals. Approximately 5 ms later, the analog voltage and current data being supplied to opto-isolators 42 and 44 via wires 26-1 . . . 26-4 (of FIG. 2) are read and supplied to the A/D converter 46 of CPU 32. The corresponding digital data is then stored in the internal memory 112 of CPU 32.

The CPU 32 performs a check 114 of the input voltage signal on wires 26-3 and 26-4 to ensure that such voltage is within a range of acceptable voltages. That is to say, the cathodic protection rectifier 100 may have been struck by lightning and has powered down or has otherwise malfunctioned. In the event that the input voltage signal supplied from the cathodic protection rectifier 100 is determined to be low and out of specification (indicative of a malfunction), an alarm condition is generated 116, and the CPU 32 logs the time and date of such alarm condition for subsequent analysis. Once an alarm condition has been logged in and recorded, or if no alarm condition is detected, the CPU 32 returns to its low power sleep mode until it is once again awakened 15 minutes later by clock 48 to read additional analog input data.

Figure 8:
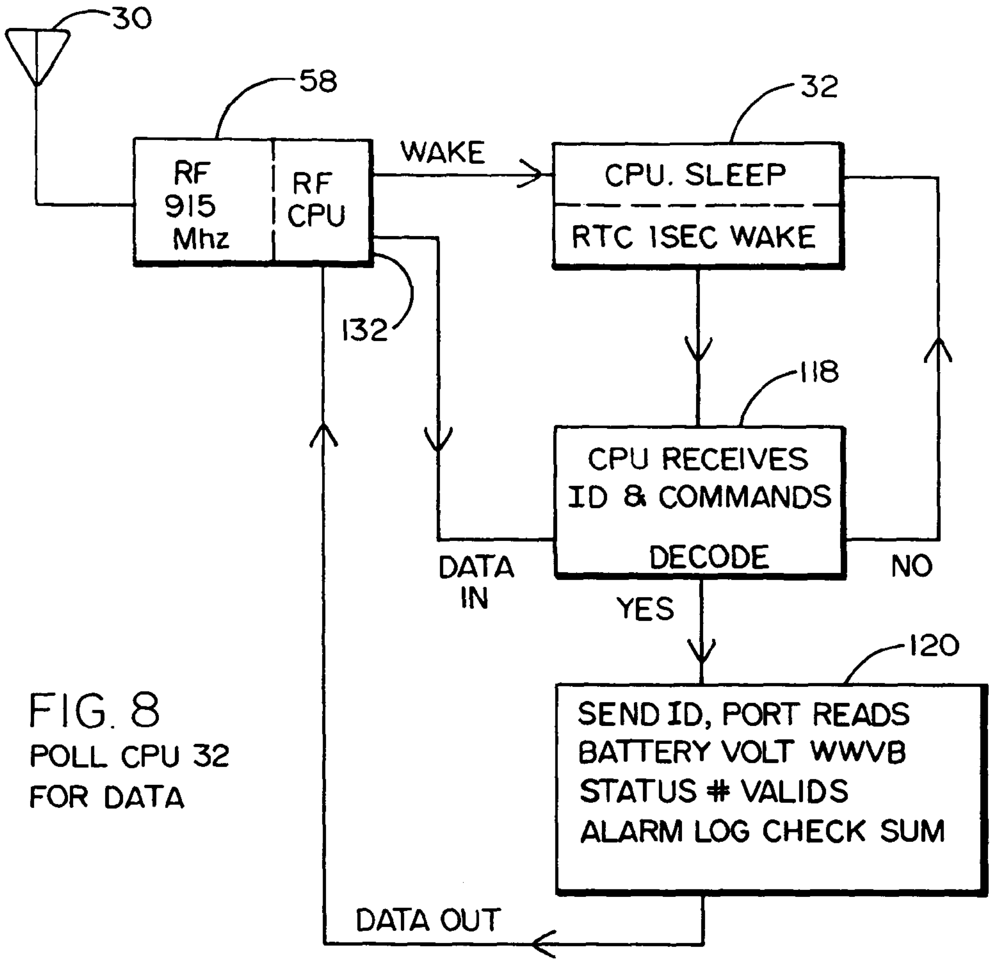

An airplane (designated 22 in FIG. 1) flying over the cathodic protection monitor 20 (or a motor vehicle 23 of FIG. 1 driving nearby) can poll the CPU 32 to collect the data that is stored in the memory thereof. In the case of FIG. 8, a polling signal is sent via antenna 30 from the airplane to an internal CPU 132 of the RF ISM band transceiver 58 (of FIG. 2). Provided that the polling signal transmitted to antenna 30 for CPU 132 includes an appropriate read/interrogation command 118, the normally asleep main CPU 32 will be awakened to send a packet of data 120 to the data collector of the airplane via transceiver 58 and antenna 30.

The data to be transmitted from the CPU 32 includes the digital current and voltage signal data that has been read from the cathodic protection rectifier 100 and stored in the memory of CPU 32 following digitization, the particular ID of the monitor 20, any alarm conditions that have been logged into the CPU (during step 116 of FIG. 7), an indication of the voltage of DC battery supply 39 (of FIG. 2), and an indication of the status of the WWVB receiver 68 (also of FIG. 2) to ensure that antenna 70 is receiving clock timing signals from the National Bureau of Standards as previously disclosed in order to conduct the government-mandated ground voltage survey along the pipeline to be monitored. After the data packet has been successfully transmitted to a data collector and an acknowledgement signal is returned, the main CPU 32 will return to its sleep mode to await a new polling signal.

Figure 9:
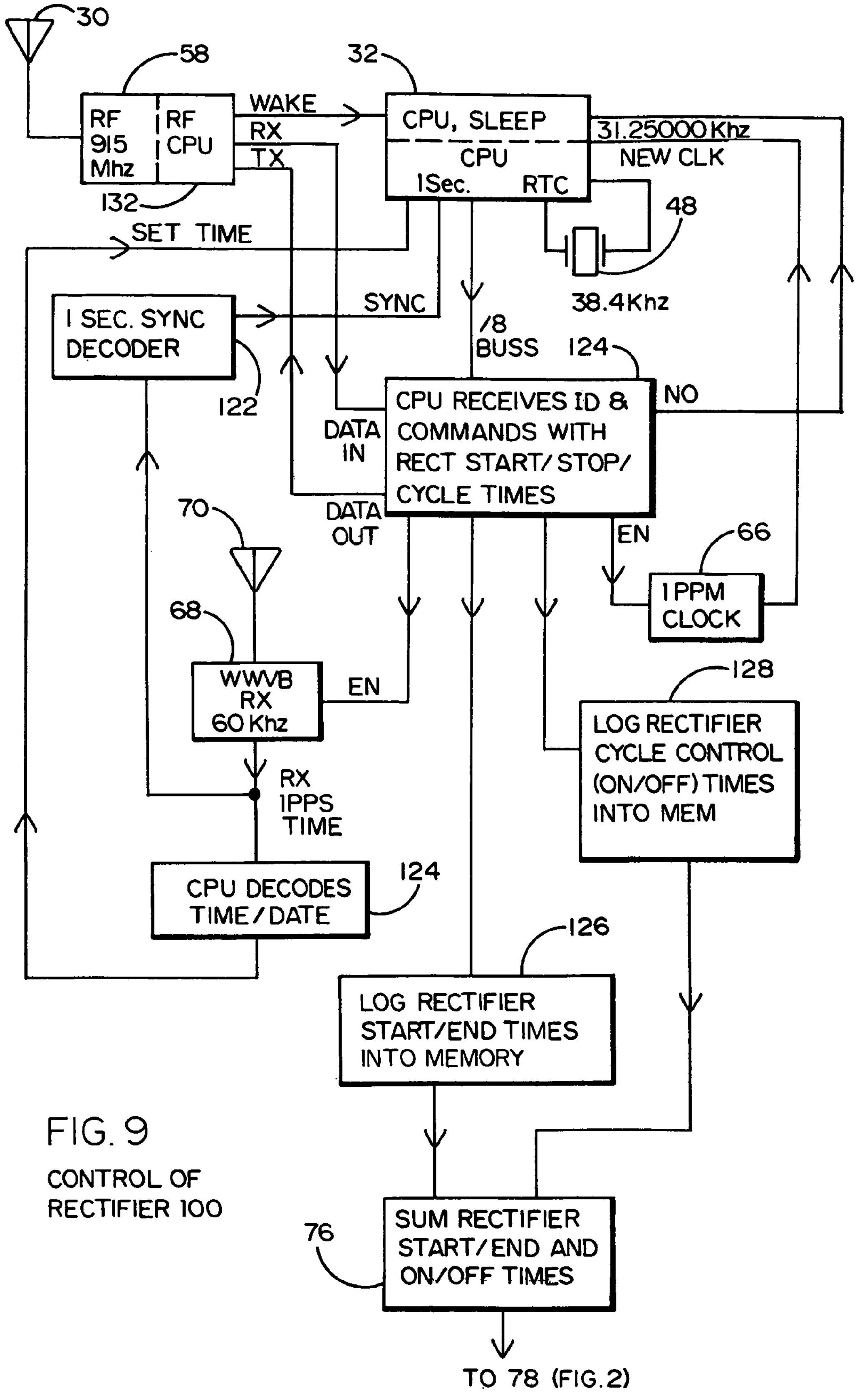

FIG. 9 describes the manner by which the cathodic protection rectifiers that are stationed at spaced locations along the pipeline are continuously turned on and off in synchronization with one another to enable the aforementioned government-mandated ground voltage survey to be completed within a predetermined workday. To provide accurate timing control signals without the expense and potential signal interruption that are typically encountered when an overhead satellite is employed for timing control, the WWVB receiver 68 (of FIG. 2) of each cathodic protection monitor 20 is in constant communication via antenna 70 with the National Bureau of Standards in Boulder, Colo.

The output of receiver 68 is connected to a one-second synchronization decoder 122 which provides synchronized timing signals to the CPU 32. The output of receiver 68 is also connected to a time/date decoder 124 so that the CPU 32 will be accurately informed of the correct time and day in order to be able to accurately start and stop the survey at the beginning and end of a designated workday.

Initially, the CPU 32 is in its low power sleep mode. The CPU 32 is awakened by a polling signal transmitted thereto (from an overhead airplane or a nearby motor vehicle) via ISM antenna 30 and the RF ISM band transceiver 58 (of FIG. 2). Provided that the polling signal includes an appropriate control command, data is loaded into CPU 32 to be logged 126 into the memory thereof. Such data represents predetermined start/stop times at which the on/off switching of the cathodic protection rectifier 100 will begin and continue until the end of the workday during which the survey is conducted. Data 128 that is logged into the memory of CPU 32 also represents predetermined times that are indicative of how long the cathodic protection rectifier 100 will be turned on and how long it will subsequently be turned off to complete one switching cycle. As was previously described while referring to FIG. 2, switched relay enable signals are transmitted from switch 76 to an opto-isolator stage 78 of each cathodic protection monitor 20 via wires 28-1 and 28-2 (of FIG. 2) to energize and de-energize the rectifier control relay (designated 90 in FIG. 3) and thereby correspondingly control the on/off switching of the cathodic protection rectifier 100 to which the cathodic protection monitor 20 is interconnected.

If the polling signal transmitted to CPU 32 via antenna 30 and transceiver 58 includes an appropriate rectifier start/end-time/date command, then the WWVB receiver 68 and the 1 ppm clock oscillator 66 (16 MHz divided to 31.25 KHz) are enabled and the time is updated every minute. Prior to the survey, the CPU 32 is in its sleep mode but wakes every minute to synchronize the clock oscillator 66 until the rectifier control start time is reached at the beginning of the workday. At this time, the CPU 32 wakes every second to generate the switched relay enable signals to the switch 76 (of FIG. 2) to be supplied to opto-isolator stage 78 to energize and de-energize the rectifier control relay 90 and thereby turn cathodic protection rectifier 100 on and off until the rectifier control stop time is reached at the end of the workday. At this point, the CPU 32 returns to its normal sleep mode.

Figure 10:
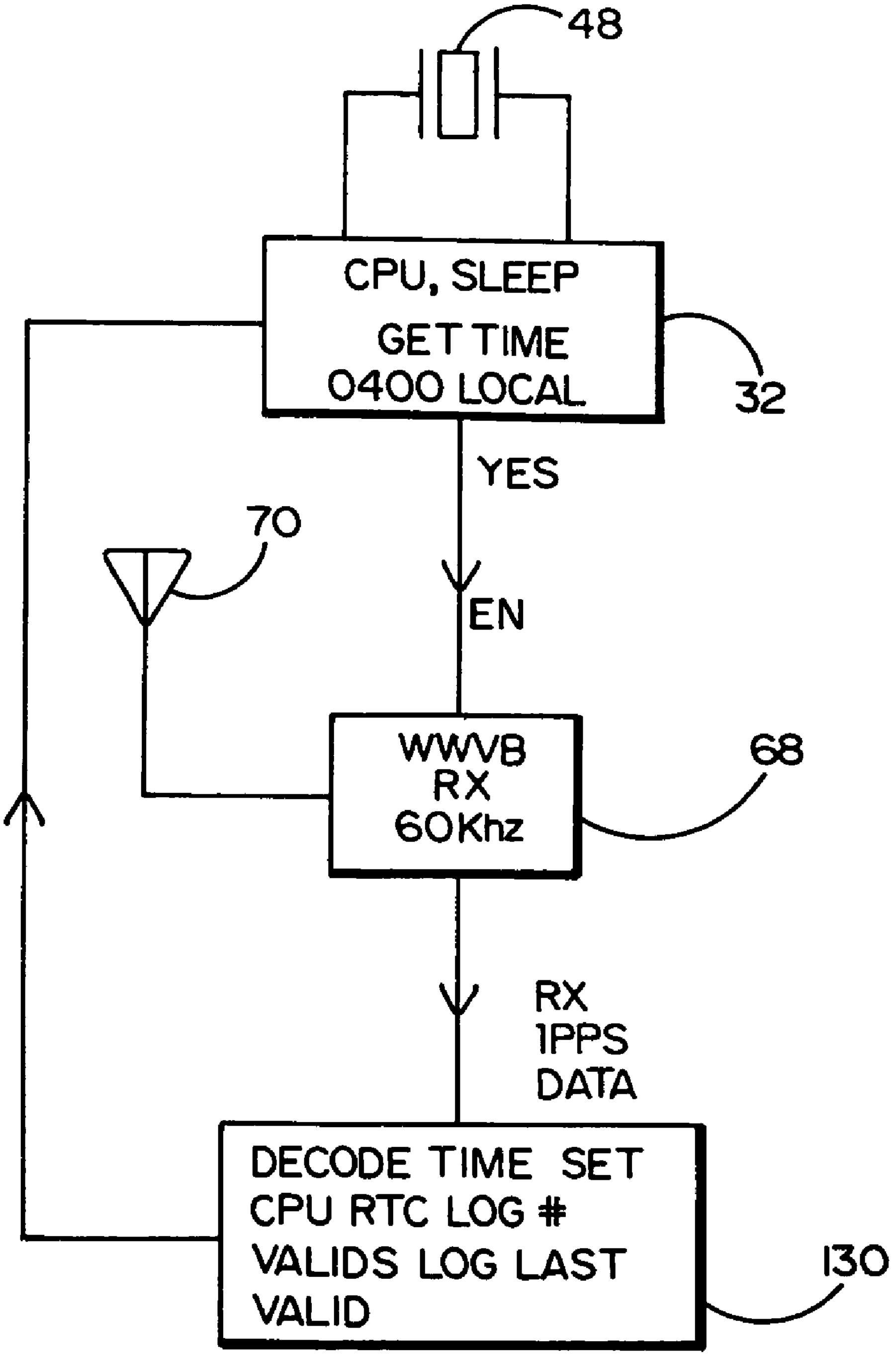

In order to ensure timing accuracy of the on-board real time clock 48 (of FIG. 2) during the survey, and turning to FIG. 10, the normally asleep CPU 32 wakes once every 24 hours. Similarly, the WWVB receiver 68 is activated once every 24 hours for a normal time update so as to determine if the receiver 68 is functioning properly and timing signals are being received at antenna 70 from the National Bureau of Standards. The CPU 32 automatically defaults to a 0400 local time if no particular predetermined time is designated. At the designated or default time, the CPU 68 enables the WWVB receiver 68. The time received from the National Bureau of Standards via antenna 70 and receiver 68 is decoded 130 and the signal strength received at antenna 70 is logged into the memory of the CPU. Depending upon the time received from the National Bureau of Standards and subsequently decoded, the CPU 32 will adjust the time of clock 48 to ensure that it is running accurately so that the times of the real time clocks from all of the cathodic protection monitors along the pipeline will coincide. The CPU 32 then returns to its normal sleep mode.

Figure 11:
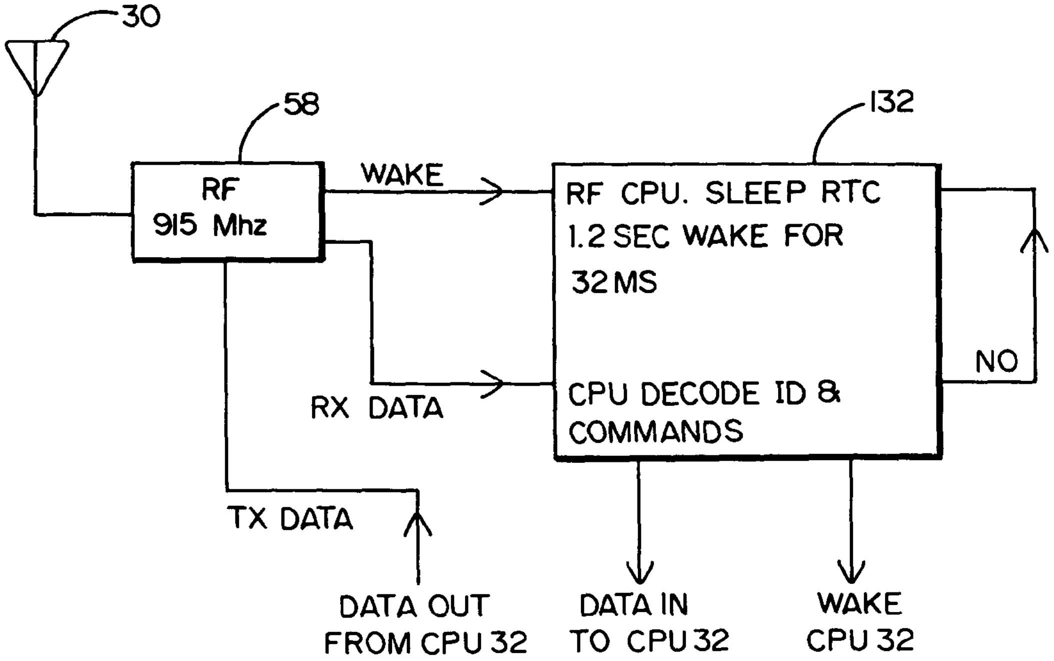

Referring to FIG. 11, the RF ISM band transceiver 58 which receives polling signals from an overhead airplane or nearby motor vehicle via the ISM antenna 30 has an internal CPU 132 that is also normally in a sleep mode. The CPU 132 of transceiver 58 wakes every 1.2 seconds for 16 ms intervals. CPU 132 checks for the receipt of a polling signal that has been transmitted to antenna 30. If an appropriate polling signal is detected, the transceiver CPU 132 wakes the main CPU 32 of cathodic protection monitor 20 so that the commands carried by the polling signal can be delivered to CPU 32 and a data packet transmitted from CPU 32 to the data collector of the airplane or motor vehicle in response to an appropriate command. If no polling signal is detected by the transceiver CPU 132, it returns to its normal sleep mode.

The invention claimed is:

1. For a plurality of cathodic protection rectifiers coupled to an underground pipe or storage tank to prevent cathodic erosion thereof, a corresponding plurality of rectifier control circuits electrically connected to respective ones of said cathodic protection rectifiers to control the operation of said rectifiers, each one of said plurality of rectifier control circuits comprising:

a central processing unit (CPU);

a clock to supply clock control signals to said CPU; and means by which the clock control signals supplied by said clock to said CPU are synchronized with the clock control signals supplied by the clocks of the other ones of said plurality of rectifier control circuits, said CPU generating timed rectifier enable signals that are dependent upon said clock control signals, said rectifier enable signals causing said cathodic protection rectifier to be turned on during a first time period and causing said cathodic protection rectifier to be turned off during a second time period.

2. The rectifier control circuit recited in claim 1, wherein each of the plurality of cathodic protection rectifiers includes a relay connected in a cathodic protection circuit to the pipe or storage tank that is coupled to the rectifier, the rectifier enable signals generated by the CPU of the said one of said plurality of rectifier control circuits causing the relay to be de-energized and said cathodic protection rectifier to be turned on during said first time period and causing the relay to be energized and said cathodic protection rectifier to be turned off during said second time period.

3. The rectifier control circuit recited in claim 2, further comprising a relay control switch to receive the rectifier enable signals generated by said CPU, said relay control switch connected between the CPU of the said one of said plurality of rectifier control circuits and the relay of the cathodic protection rectifier, said relay control switch being opened and closed by said rectifier enable signals to correspondingly open and close the cathodic protection circuit in which the relay is connected.

4. The rectifier control circuit recited in claim 3, wherein said relay control switch is electrically isolated from the relay of the cathodic protection rectifier by means of an opto-isolator located therebetween.

5. The rectifier control circuit recited in claim 1, wherein the means to synchronize the clock control signals supplied by the clock of each of said plurality of rectifier control circuits includes a receiver coupled to the clock of each rectifier control circuit and an antenna connected to said receiver, each antenna tuned to receive clock synchronization signals from a clock synchronization source, and said clock synchronization signals regulating the timing of the clock control signals supplied by the clocks of said plurality of rectifier control signals, such that the plurality of cathodic protection rectifiers are simultaneously turned on during said first time period and are simultaneously turned off during said second time period.

* * * * *